United States Patent
Nozaki

(10) Patent No.: US 7,432,719 B2
(45) Date of Patent: Oct. 7, 2008

(54) ABNORMALITY MONITORING APPARATUS IN LOAD DRIVE CIRCUIT

(75) Inventor: Takeshi Nozaki, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 36 days.

(21) Appl. No.: 10/579,212

(22) PCT Filed: Oct. 29, 2004

(86) PCT No.: PCT/IB2004/003550

§ 371 (c)(1),
(2), (4) Date: May 12, 2006

(87) PCT Pub. No.: WO2005/049336

PCT Pub. Date: Jun. 2, 2005

(65) Prior Publication Data

US 2007/0120530 A1    May 31, 2007

(30) Foreign Application Priority Data

Nov. 19, 2003  (JP) .............................. 2003-389644

(51) Int. Cl.
*G01R 31/08* (2006.01)
*G01N 27/416* (2006.01)

(52) U.S. Cl. ........................ 324/522; 324/429; 324/432; 324/433

(58) Field of Classification Search .................. 324/522, 324/433, 429, 432
See application file for complete search history.

(56) References Cited

U.S. PATENT DOCUMENTS 6,255,826 B1 *  7/2001  Ohsawa et al. .............. 324/426

(Continued)

FOREIGN PATENT DOCUMENTS

EP          1 281 562 A2      2/2003

(Continued)

OTHER PUBLICATIONS

International Search Report, Jan. 31, 2005.

(Continued)

*Primary Examiner*—Vincent Q Nguyen
(74) *Attorney, Agent, or Firm*—Kenyon & Kenyon LLP

(57) ABSTRACT

An ECU performs a program. In the program, in the case where a converter is performing an operation for increasing a voltage (i.e., YES in step S 102), when a difference between an estimated battery voltage VBE and a battery voltage VB has continued to be large (i.e., YES in step S 104), the ECU tentatively determines that a battery voltage sensor is abnormal (S 106), and stops voltage increasing control for the converter (S 108). If an absolute value of a difference between a battery voltage and an output side voltage is large (i.e., YES in step S 110), a difference A which is an absolute value between an estimated battery voltage and a battery voltage, and a difference B which is an absolute value between the estimated battery voltage and an output side voltage are calculated (S 112). If a value obtained by subtracting the difference B from the difference A has continued to be large (i.e., YES in step S 114), it is determined that the battery voltage sensor is abnormal (S 116). If a voltage obtained by subtracting the difference A from the difference B has continued to be large (i.e., YE in step S 118), it is determined that the output side voltage sensor is abnormal (S 120).

13 Claims, 7 Drawing Sheets

U.S. PATENT DOCUMENTS

| | | | |
|---|---|---|---|
| 6,285,163 B1 * | 9/2001 | Watanabe et al. | 320/132 |
| 6,757,598 B2 * | 6/2004 | Okoshi | 701/22 |
| 6,775,115 B2 | 8/2004 | Sato | |
| 2003/0132756 A1 * | 7/2003 | Nomura et al. | 324/522 |
| 2006/0033476 A1 * | 2/2006 | Reynolds et al. | 320/141 |

FOREIGN PATENT DOCUMENTS

| | | |
|---|---|---|
| EP | 1 322 028 A2 | 6/2003 |
| JP | 08-051800 A | 2/1996 |
| JP | 08-214592 A | 8/1996 |
| JP | 09-023501 A | 1/1997 |
| JP | 2000-162249 A | 6/2000 |
| JP | 2000-166105 A | 6/2000 |
| JP | 2000-206221 A | 7/2000 |
| JP | 2001-159574 A | 6/2001 |
| JP | 2003-068366 A | 3/2003 |
| JP | 2003-189599 A | 7/2003 |

OTHER PUBLICATIONS

Written Opinion of International Searching Authority, Jan. 31, 2005.

* cited by examiner

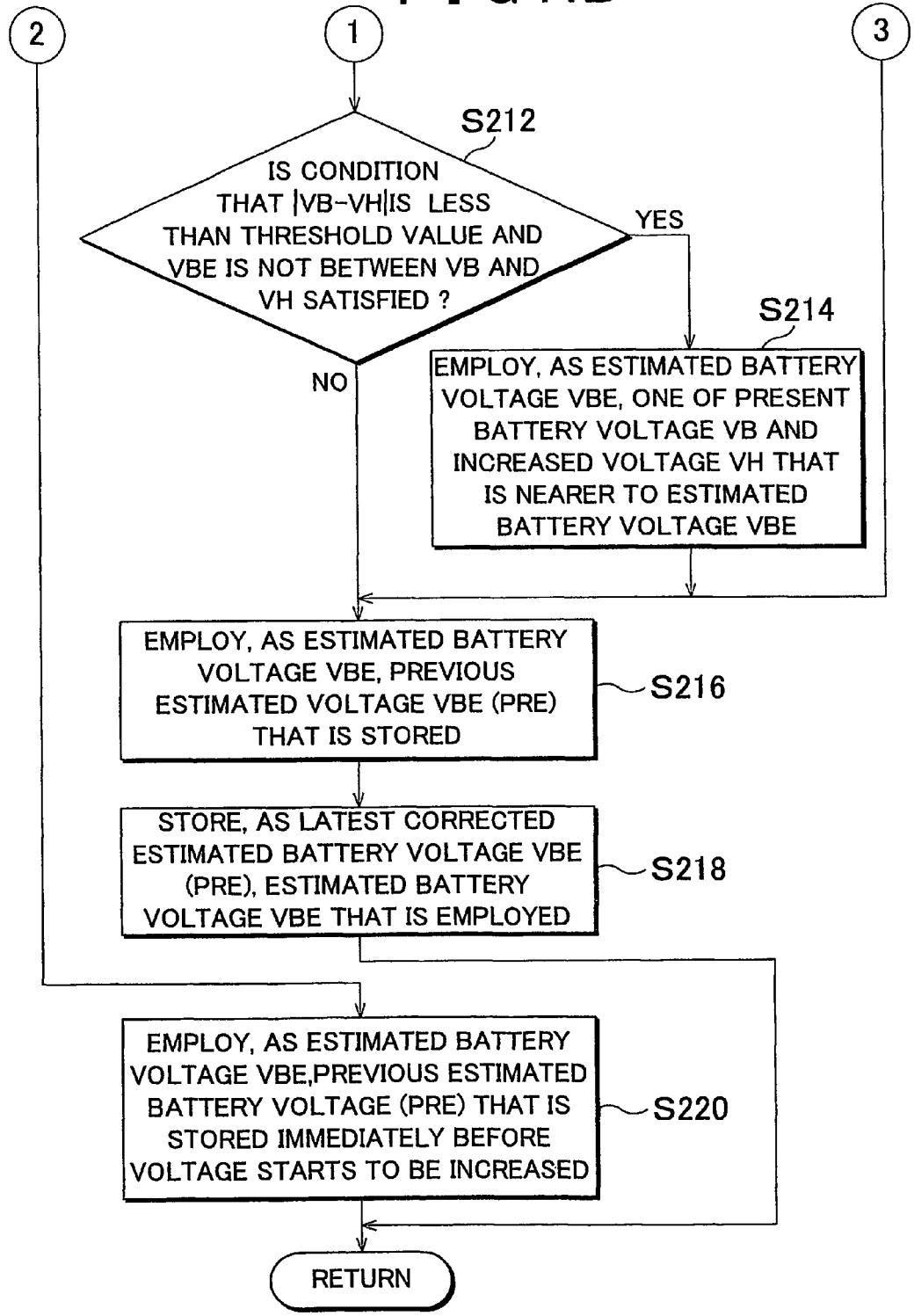

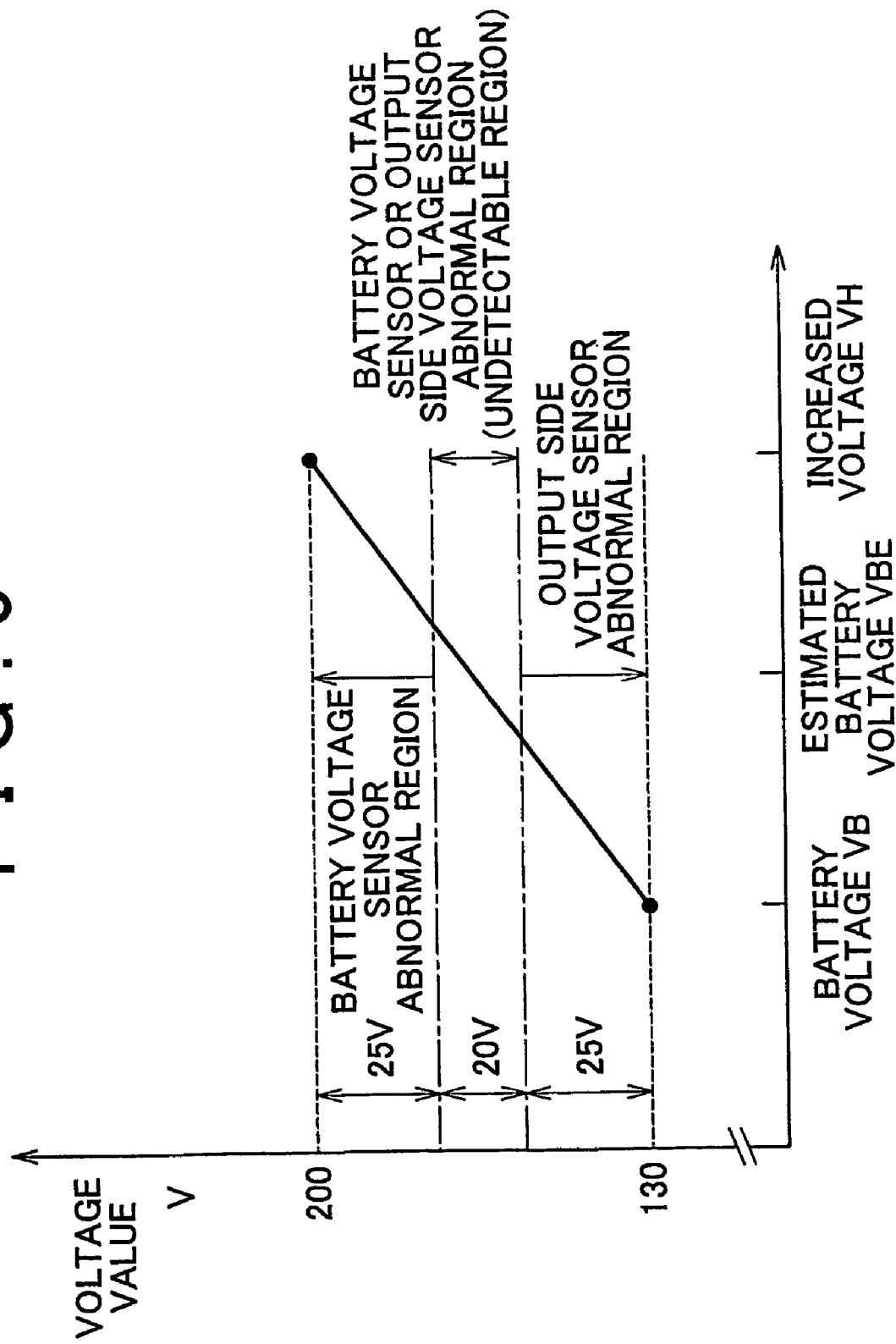

ABNORMALITY MONITORING APPARATUS IN LOAD DRIVE CIRCUIT

This is a 371 national phase application of PCT/IB2004/003550 filed 29 Oct. 2004, claiming priority to Japanese Patent Application No. JP 2003-389644 filed 19 Nov. 2003, the contents of which are incorporated herein by reference.

BACKGROUND OF THE INVENTION

1. Field of the Invention

The invention relates to an electric load drive circuit that drives a load installed in a vehicle. More particularly, the invention relates to an apparatus that monitors an abnormality of a sensor in the load drive circuit.

2. Description of the Related Art

Recently, a 42-volt electric power source system for an automobile, in which a 42-volt electric power source is added to a conventional 14-volt electric power source has been proposed, in order to supply electric power to electric equipment having a large capacity installed in the automobile, such as an electric power steering and an electric air conditioner. In the 42-volt electric power source, since the voltage is three times as high as the voltage in the conventional 14-volt electric power source, electric current can be reduced to one-third, which leads to a reduction in loss and a reduction in weight of the harness. Also, electric power can be supplied to a load having a large capacity more easily. The capacity of a battery is larger than a conventional battery. Further, there is a possibility that a nickel-hydrogen battery or a lithium ion battery will be employed instead of a lead battery that is currently employed.

However, the lifetime of a lamp and the like may be shortened when only the 42-volt electric power source is used. Therefore, the conventional 14-volt electric power source needs to be used as it is, together with the 42-volt electric power source. Thus, recently, an electric power source system including a 42-volt main battery, a 14-volt auxiliary battery, and a DC-DC converter for increasing and decreasing the voltage has been proposed. In the 14-volt battery, the charging voltage is 14 volts and the discharging voltage is 12 volts. In the 42-volt battery, the charging voltage is 42 volts and the discharging voltage is 36 volts.

In addition to such an electric power source system, there are cases where a low voltage of electric power discharged from a battery is increased by a DC-DC converter so as to supply the electric power to an inverter of a motor in a hybrid vehicle in which driving power of an engine is assisted by the motor. In such cases, a rated voltage of the motor for driving the vehicle is usually set to a high value in order to reduce weight of the harness by reducing electric current supplied to the motor for driving the vehicle, and to obtain high driving power for driving the vehicle. Meanwhile, in order to increase the voltage of the battery installed in the vehicle, a large number of battery cells of approximately 1.2 volts need to be connected in series. In the case where the rated voltage of the motor cannot be obtained even if a large number of battery cells are connected in series, the voltage of electric power discharged from the battery is increased by the DC-DC converter, and the electric power is supplied to the motor via the inverter.

Thus, in an electric circuit installed in a vehicle, it may be necessary to increase or decrease the voltage of electric power supplied to and from a battery. In such a case, a DC-DC converter is used. Japanese Patent Application Publication No. JP-A-H8-214592 discloses a drive apparatus for a motor in which the motor can be driven, regenerative braking can be performed, and charging of a battery can be performed using a simple configuration, and further the battery can be refreshed.

The drive apparatus for a motor includes a drive circuit; a chopper circuit; a direct current side reactor; and a control circuit. The drive circuit includes one or more arms formed by connecting two switching elements having a flywheel diode in series, and an input terminal thereof is connected to a battery, and an output terminal thereof is connected to the motor. Thus, the drive circuit controls the motor through energization by turning the switching elements on and off. The chopper circuit is connected to the drive circuit in parallel, and is formed by connecting two switching elements having a flywheel diode. The direct current side reactor is connected between a neutral point of the chopper circuit and the battery. The control circuit is provided for performing on-off control of the switching elements of the drive circuit and chopper circuit. The control circuit allows the chopper circuit to function as a chopper for increasing a voltage when electric power is supplied from the battery to the drive circuit, and to function as a chopper for decreasing a voltage when electric power is supplied from the drive circuit to the battery. Particularly, the control circuit performs control such that electric power the voltage thereof is equal to a reference voltage of the battery is supplied to the drive circuit when the output of the motor is low, and the chopper circuit functions as the chopper for increasing the voltage when the output of the motor is high.

In the drive apparatus for a motor disclosed in the Japanese Patent Application Publication No. JP-A-H8-214592, since the chopper circuit can function as a chopper for increasing the voltage when electric power is supplied from the battery to the motor via the drive circuit, a voltage higher than the battery voltage can be applied to the motor, and accordingly the motor can be driven at a speed higher than a steady-state speed. Also, since the chopper circuit can function as a chopper for decreasing the voltage when electric power is supplied from the drive circuit to the battery, the battery can be charged without causing damage to a circuit element even if the voltage of electric power generated by the motor or the voltage of an external electric power source is higher than the battery voltage in the case where electric power is generated by the motor during regenerative braking, or in the case where the battery is charged using an external electric power source.

Also, Japanese Patent Application Publication No. JP-A-H8-51800 discloses a control method in which a battery voltage is estimated such that control can continue to be performed even if an abnormality or the like occurs in a voltage sensor. The control method includes the steps of determining a primary voltage of a motor based on the battery voltage and a previous switching pattern; estimating a primary magnetic flux of the motor and a present value of motor torque based on the primary voltage of the motor and the primary electric current of the motor; determining a command value indicating the primary magnetic flux of the motor and a command value indicating the motor torque based on required output; deciding a switching pattern by comparing the estimated primary magnetic flux of the motor and the estimated present value of the motor torque and the determined command value indicating the primary magnetic flux of the motor and the determined command value indicating the motor torque; changing the primary electric current of the motor according to the decided switching pattern so as to control an induction motor. In the control method, the battery voltage is detected by the voltage sensor during normal operation, and the battery voltage is estimated based on a load state of the battery when an output of the voltage sensor is abnormal.

According to the control method, in the case where the voltage sensor outputs an abnormal value due to a failure of the voltage sensor for detecting the battery voltage, to a superimposition of noise onto the output of the sensor, or the like, the estimated value of the battery voltage is used. Accordingly, even when the voltage sensor outputs an abnormal value, control can continue to be performed according to a logic of high-speed direct torque control. Also, even when the estimated value of the battery voltage has an error, the control state does not become unstable as long as the error is not extremely large. Since the battery voltage is estimated based on the load state of the battery, the estimated value does not have a large error, and accordingly the control can be performed stably in a wide range.

As described above, in the drive apparatus for a motor disclosed in the Japanese Patent Application Publication No. JP-A-H8-214592, the chopper circuit is provided in parallel with the inverter circuit, the chopper circuit functions as a chopper for increasing the voltage when the output of the motor is high, and the chopper circuit functions as a chopper for decreasing the voltage when electric power is generated by the motor during regenerative braking. If an abnormality occurs in the voltage sensor when the voltage is adjusted in this manner, accurate voltage control cannot be performed, which may lead to deterioration of the battery and the like. Also, it is not possible to determine which one of the voltage sensor for detecting the increased voltage on an output side of the DC-DC converter and the voltage sensor for the battery is abnormal simply by comparing voltage values detected by these voltage sensors.

Also, according to the control method disclosed by the Japanese Patent Application Publication No. JP-A-H8-51800, a configuration including a DC-DC converter is not employed. An abnormality of the battery voltage sensor is determined simply based on a relation between the battery output and the battery voltage. If it is determined that the battery voltage sensor is abnormal, the induction motor is controlled using the estimated battery voltage. In other words, an abnormality of the battery voltage sensor is detected only when the relation between the battery output and the battery voltage deviates from the relation shown in a map.

Thus, in both cases, for example, when a voltage sensor for detecting the voltage that has not been increased is not provided on an input side of the DC-DC converter in order to suppress an increase of cost, and only the voltage sensor for detecting the increased voltage and the voltage sensor for the battery are provided, even if an abnormality occurs in one of the voltage sensors, it is not possible to detect an abnormality of the voltage sensor simply by comparing values detected by the voltage sensors.

SUMMARY OF THE INVENTION

In view of the above, it is an object of the invention to provide an abnormality monitoring apparatus in a load drive circuit including a converter and a battery for supplying electric power to a load, which monitors an abnormality of a sensor for detecting a voltage in each of the portions of the load drive circuit.

A first aspect of the invention relates to an abnormality monitoring apparatus in a load drive circuit which includes a converter for performing at least one of the operation for increasing a voltage and the operation for decreasing a voltage, and a battery connected to an input side of the converter, the converter supplying electric power to a load. The abnormality monitoring apparatus includes first detecting means for detecting a voltage value of the battery; second detecting means for detecting a voltage value on an output side of the converter; battery voltage estimating means for calculating an estimated voltage value of the battery; calculating means for calculating at least one of a difference value between the voltage value detected by the first detecting means and the estimated voltage value and a difference value between the voltage value detected by the second detecting means and the estimated voltage value; and monitoring means for monitoring at least one of an abnormality of the first detecting means, and an abnormality of the second detecting means based on each of the difference values and a predetermined threshold value.

According to the first aspect of the invention, for example, even in the case where the converter is performing the operation for increasing the voltage or the operation for decreasing the voltage, the voltage value detected by the voltage sensor that is the first detecting means and the estimated voltage value calculated by the battery voltage estimating means are the same or substantially the same as long as the voltage sensor is normal. Therefore, the difference value therebetween does not exceed the threshold value. However, if the voltage sensor is abnormal, the difference value exceeds the threshold value. Accordingly, the monitoring means can monitor an abnormality of the first detecting means by comparing the difference value and the threshold value in the case where the converter is performing the operation for increasing the voltage or the operation for decreasing the voltage.

If such an abnormality is detected, the converter stops the operation for increasing the voltage or the operation for decreasing the voltage. In the case where the operation of the converter is stopped, the voltage value detected by the voltage sensor that is the first detecting means and the estimated voltage value calculated by the battery voltage estimating means are the same or substantially the same if the voltage sensor is normal. Therefore, the difference value therebetween does not exceed the threshold value. However, if the voltage sensor is abnormal, the difference value exceeds the threshold value. Accordingly, the monitoring means can monitor an abnormality of the first detecting means by comparing the difference value and the threshold value.

Further, in the case where the operation of the converter is stopped, the voltage value detected by the voltage sensor that is the second detecting means and the estimated voltage value calculated by the battery voltage estimating means are the same or substantially the same if the voltage sensor is normal. Therefore, the difference value therebetween does not exceed the threshold value. However, if the voltage sensor is abnormal, the difference value exceeds the threshold value. Accordingly, the monitoring means can monitor an abnormality of the second detecting means by comparing the difference value and the threshold value.

The voltage value detected by the voltage sensor that is the first detecting means and the voltage value detected by the voltage sensor that is the second detecting means are the same or substantially the same as the estimated voltage value calculated by the battery voltage estimating means if these voltages sensors are normal. Therefore, each of the difference values does not exceed the threshold value. However, if one of the voltage sensors is abnormal or if both of the voltage sensors are abnormal, one of the difference values exceeds the threshold value or both of the difference values exceed the threshold value. Accordingly, the monitoring means can monitor an abnormality of the first detecting means or/and the second detecting means by comparing each of the difference values and the threshold value. As a result, it is possible to provide the abnormality monitoring apparatus in a load drive circuit including a converter and a battery for supplying electric power to a load, which monitors an abnormality of a sensor for detecting a voltage in each of the portions of the load drive circuit.

In the first aspect of the invention, the monitoring means may include abnormality detecting means for detecting an abnormality of the first detecting means based on an absolute value of the difference between the voltage value of the battery detected by the first detecting means and the estimated voltage value in a case where the converter is performing the operation for increasing the voltage or the operation for decreasing the voltage. With this configuration, in the case where the converter is performing the operation for increasing the voltage or the operation for decreasing the voltage, and the voltage sensor that is the first detecting means is normal, the voltage value detected by the voltage sensor and the estimated voltage value calculated by the battery voltage estimating means are the same or substantially the same. Therefore, the difference value therebetween does not exceed the threshold value. However, if the voltage sensor is abnormal, the difference value exceeds the threshold value. Accordingly, the monitoring means can detect an abnormality of the first detecting means by comparing the difference value and the threshold value in the case where the converter is performing the operation for increasing the voltage or the operation for decreasing the voltage.

In the first aspect of the invention, the abnormality monitoring apparatus may further include control means for controlling the converter such that the converter stops the operation for increasing the voltage or the operation or the operation for decreasing the voltage when an abnormality of the first detecting means is tentatively detected in a case where the converter is performing the operation for increasing the voltage or the operation for decreasing the voltage. The monitoring means may also include determining means for determining abnormal detecting means from among the first detecting means and the second detecting means based on an absolute value of the difference between the voltage value of the battery detected by the first detecting means and the estimated voltage value, and an absolute value of the difference between the voltage value detected by the second detecting means and the estimated voltage value when the converter stops the operation for increasing the voltage or the operation for decreasing the voltage. With this configuration, in the case where the converter stops the operation for increasing the voltage or the operation for decreasing the voltage, that is, the operation of the converter is stopped, the voltage value detected by the voltage sensor that is the first detecting means and the estimated voltage value calculated by the battery voltage estimating means are the same or substantially the same if the voltage sensor is normal Therefore, the difference value therebetween does not exceed the threshold value. However, if the voltage sensor is abnormal, the difference value exceeds the threshold value. Accordingly, the monitoring means can monitor an abnormality of the first detecting means by comparing the difference value and the threshold value.

Further, in the case where the operation of the converter is stopped, the voltage value detected by the voltage sensor that is the second detecting means and the estimated voltage value calculated by the battery voltage estimating means are also the same or substantially the same if the voltage sensor is normal. Therefore, the difference value therebetween does not exceed the threshold value. However, if the voltage sensor is abnormal, the difference value exceeds the threshold value. Accordingly, the monitoring means can monitor an abnormality of the second detecting means by comparing the difference value and the threshold value.

Further, the absolute value (first absolute value) of the difference between the voltage value detected by the voltage sensor (first voltage sensor) that is the first detecting means and the estimated voltage value is compared with the absolute value (second absolute value) of the difference between the voltage value detected by the voltage sensor (second voltage sensor) that is the second detecting means and the estimated voltage value. If a difference obtained by subtracting the second absolute value from the first absolute value is large, it can be determined that the first voltage sensor is abnormal. If a difference obtained by subtracting the first absolute value from the second absolute value is large, it can be determined that the second voltage sensor is abnormal. Thus, the abnormal voltage sensor can be determined.

In the first aspect of the invention and a related aspect of the invention, the abnormal monitoring apparatus may further include electric current value detecting means for detecting an electric current value of the battery; and the battery voltage estimating means may include estimated voltage value calculating means for calculating the estimated voltage value based on an electric power command value indicating a value of electric power supplied to the load and the electric current value of the battery. With this configuration, since an electric power value is calculated by multiplying a voltage value by an electric current value, the estimated voltage value of the battery can be calculated, for example, by dividing the electric power command value by the electric current value of the battery.

In the first aspect of the invention and the related aspect of the invention, the battery voltage estimating means may include estimated voltage value learning calculating means for learning and calculating the estimated voltage value. With this configuration, the estimated voltage value is calculated based on the electric power command value and the electric current value of the battery at predetermined time intervals (i.e., at a sampling time). In the case where the converter stops the operation for increasing voltage or the operation for decreasing voltage, that is, the operation of the converter is stopped, and both of the voltage sensor that is the first detecting means and the voltage sensor that is the second detecting means are normal, the voltage values detected by the voltage sensors are the same or substantially the same.

In this case, if the estimated voltage value of the battery that is calculated is near to the voltage values detected by these voltage sensors (for example, if the estimated voltage value is between the voltage values detected by these voltage sensors), the estimated voltage value that is calculated is employed as the estimated voltage value of the battery. If the estimated voltage value of the battery that is calculated is not near to the voltage values detected by these voltage sensors (for example, if the estimated voltage value is not between the voltage values detected by these voltage sensors), the detected voltage value that is nearer to the estimated voltage value that is calculated (i.e., one of the voltage value detected by the first detecting means and the voltage value detected by the second detecting means) is employed as the estimated voltage value of the battery, instead of the estimated voltage value that is calculated. If none of these conditions is satisfied, the latest estimated voltage value that is employed one sampling step before is further employed as the estimated voltage value of the battery. Thus, the estimated voltage value of the battery can be employed more accurately by performing learning at each sampling time.

In the first aspect of the invention and the related aspect of the invention, the monitoring means may include abnormality monitoring means for monitoring an abnormality of at least one of the first detecting means and the second detecting means by continuing to monitor an abnormal state of at least one of the first detecting means and the second detecting means for a predetermined time or more. With this configuration, since an abnormal state continues to be monitored for a predetermined time or more, it is possible to prevent malfunction due to a temporary abnormality of the voltage sensor that is the detecting means for detecting the voltage.

A second aspect of the invention relates to an abnormality monitoring method in a load drive circuit which includes a converter for performing at least one of an operation for increasing a voltage and an operation for decreasing a voltage, and a battery connected to an input side of the converter, the converter supplying electric power to a load. The abnormality monitoring method includes the steps of detecting a voltage value of the battery detecting a voltage value on an output side of the converter; calculating an estimated voltage value of the battery; calculating at least one of the difference value between the detected voltage value of the battery and the estimated voltage value, and the difference value between the detected voltage value on the output side of the converter and the estimated voltage value; and monitoring at least one of an abnormality of detection of the voltage value of the battery and an abnormality of detection of the voltage value on the output side of the converter based on each of the difference values and a predetermined threshold value.

BRIEF DESCRIPTION OF THE DRAWINGS

FIGS. 4A, 4B is a flowchart showing a control structure of a program (sub routine) performed by the ECU in FIG. 4; and FIG. 5 is a diagram describing a determination of an abnormal sensor.

DETAILED DESCRIPTION OF THE PREFERRED EMBODIMENTS

Hereinafter, description will be made on a vehicle including an ECU 1000 which is an abnormality monitoring apparatus according to an embodiment of the invention.

Figure 1:
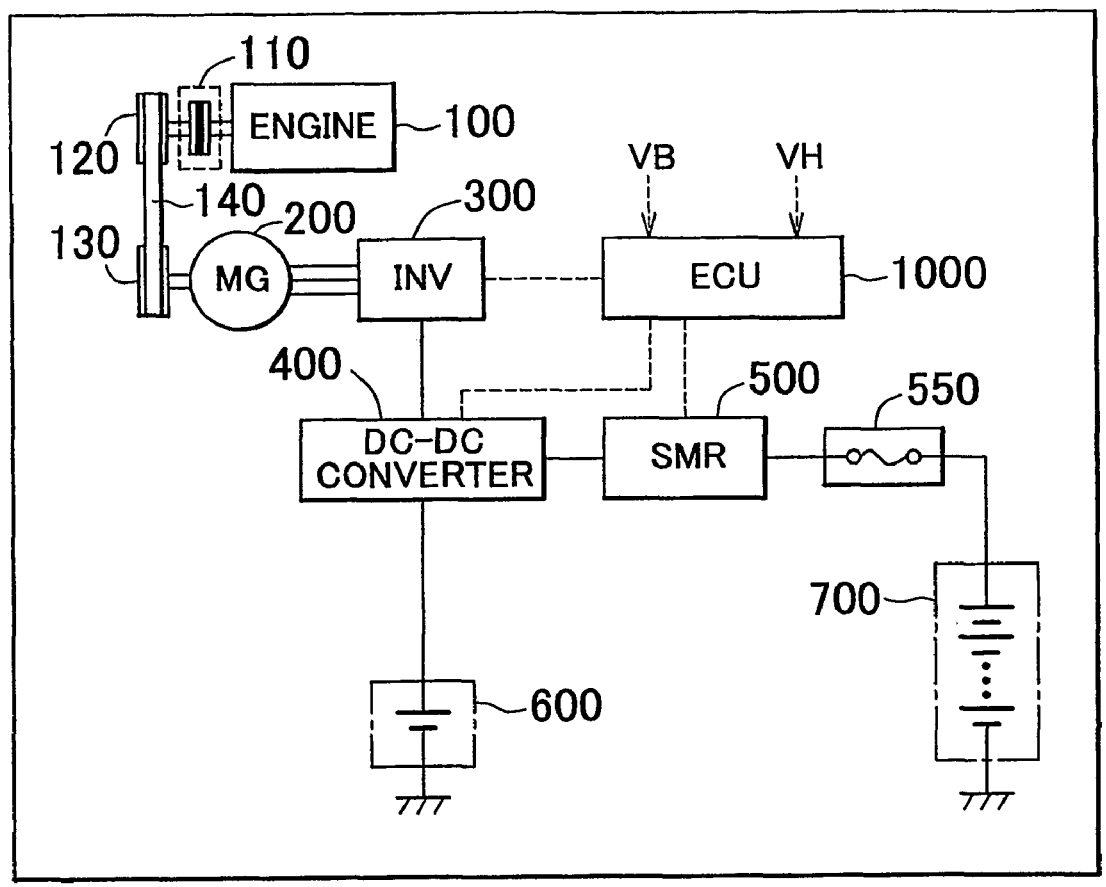
FIG. 1 is a control block diagram showing a vehicle including an abnormality monitoring apparatus according to an embodiment of the invention.

FIG. 1 is a control block diagram showing a vehicle including the ECU 1000 which is the abnormality monitoring apparatus according to the embodiment of the invention. As shown in FIG. 1, the vehicle includes an engine 100; a motor-generator 200 that functions as a motor to assist the engine 100; an inverter 300 which supplies electric power to the motor-generator 200; and a DC-DC converter 400 which performs at least one of an operation for increasing a voltage of electric power supplied to/from a battery and an operation for decreasing a voltage of electric power supplied to/from a battery, in order to supply electric power having a predetermined voltage value to a load such as the inverter 300.

Also, the DC-DC converter 400 is connected to a first battery 600 (in this embodiment, it is assumed that the first battery 600 is a 14-volt battery—however, the invention is not limited to the 14-volt battery), and a second battery 700 (in this embodiment, it is assumed that the second battery 700 is a 42-volt battery—however, the invention is not limited to the 42-volt battery), via a system main relay 500 and a fuse 550. The DC-DC converter 400 can increase the voltage of electric power discharged from the first battery 600 and the second battery 700 to a rated voltage of the inverter 300.

A crankshaft pulley 120 of the engine 100 is connected to a motor-generator pulley 130 via an electromagnetic clutch 110 using a belt 140. When the motor-generator 200 receives electric power from the inverter 300 and functions as a motor, the motor-generator 200 assists the engine 100. When the vehicle is in a regenerative braking state, the motor-generator 200 functions as a generator, converts running kinetic energy to electric energy, and charges the battery with electric power, in order to use driving power from a driving wheel connected to the crankshaft of the engine 100 for regenerative braking.

The ECU 1000 is connected to the inverter 300, the DC-DC converter 400, and the system main relay 500. The ECU 1000 sends a control signal to each of the inverter 300, the DC-DC converter 400, and the system main relay 500. In FIG. 1, control signal lines are indicated by dashed lines. Also, the engine 100 is controlled by an engine ECU (not shown).

The vehicle shown in FIG. 1 includes an idling stop system in which the engine 100 is automatically stopped and electric power supplied to auxiliary machinery is controlled using the second battery 700, for example, when the vehicle is stopped at a red light. However, the invention is not limited to the vehicle including such an idling stop system. The invention may be applied to a so-called hybrid vehicle in which an engine and a motor are used as driving sources. Alternatively, the invention may be applied to a load driving circuit which does not include a motor-generator for assisting the engine 100, and which includes only the battery 600, the DC-DC converter 400, the load connected to the DC-DC converter 400, and the ECU that performs control thereof.

Figure 2:
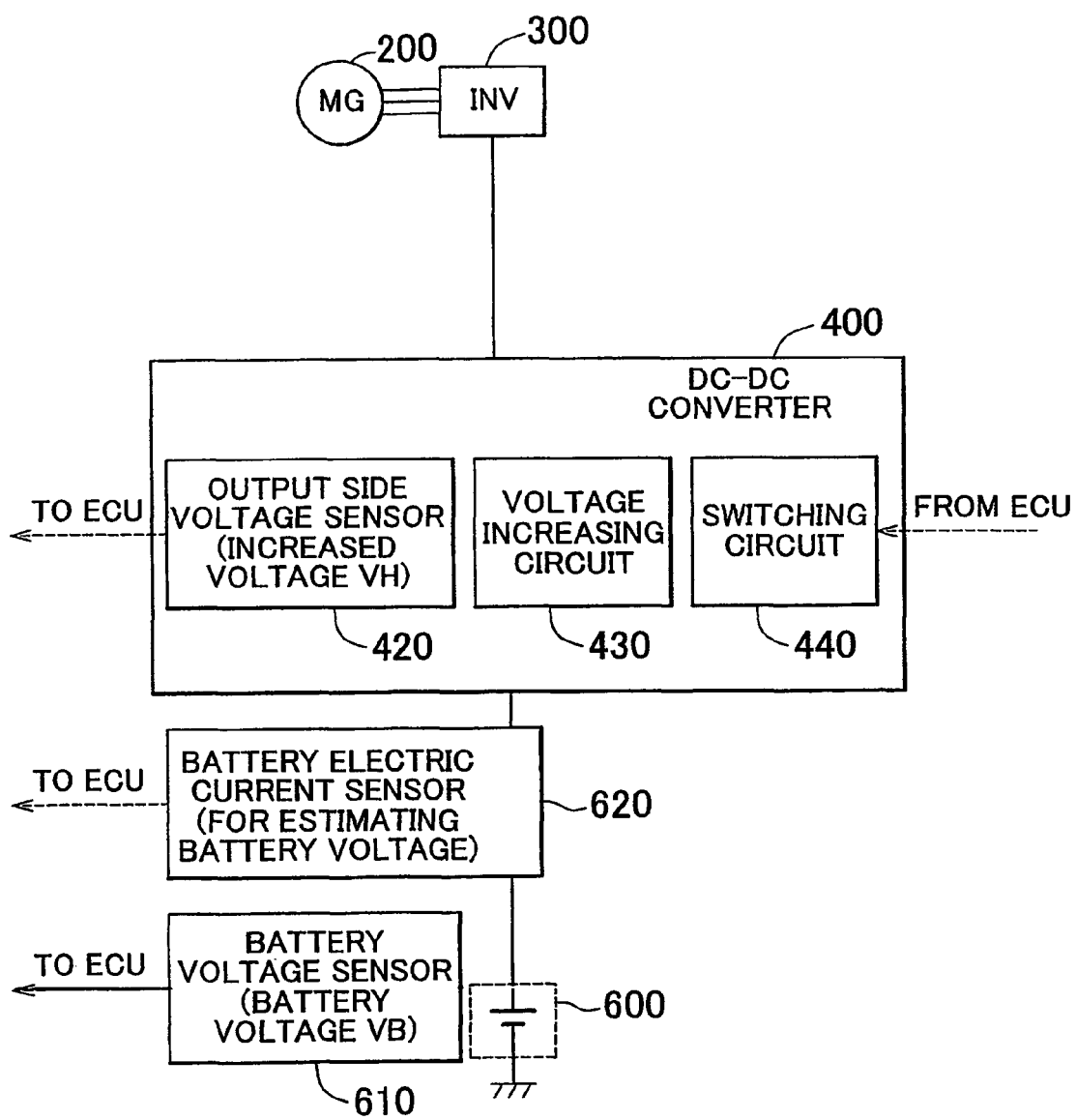
FIG. 2 is a partial enlarged diagram which partially enlarges FIG. 1.

FIG. 2 is a partial enlarged diagram which partially enlarges FIG. 1. As shown in FIG. 2, the DC-DC converter 400 includes an output side voltage sensor 420, a voltage increasing circuit 430, and a switching circuit 440. The DC-DC converter 400 is characterized in that the DC-DC converter 400 does not have an input side voltage sensor. The switching circuit 440 controls the voltage increasing circuit 430 of the DC-DC converter 400 based on the control signal sent from the ECU 1000 so as to increase the voltage of electric power discharged from the first battery 600 to a predetermined voltage, and to supply the electric power to the inverter 300.

The output side voltage sensor 420 is connected to an output side circuit of the DC-DC converter 400. The output side voltage sensor 420 detects an increased voltage VH, and sends the increased voltage VH to the ECU 1000. The output side voltage sensor 420 may be provided outside the DC-DC converter 400.

As shown in FIG. 2, a battery voltage sensor 610 for detecting a battery voltage VB of the first battery 600 and a battery electric current sensor 620 are provided in the first battery 600. The battery voltage VB detected by the battery voltage sensor 610 and a battery electric current IB detected by the battery electric current sensor 620 are sent to the ECU 1000.

As shown in FIG. 1 and FIG. 2, the battery voltage VB and the increased voltage VH are inputted to the ECU 1000. The ECU 1000 monitors an abnormality by determining which voltage sensor is abnormal based on the voltage values inputted to the ECU 1000 and an estimated battery voltage VBE.

Figure 3A:
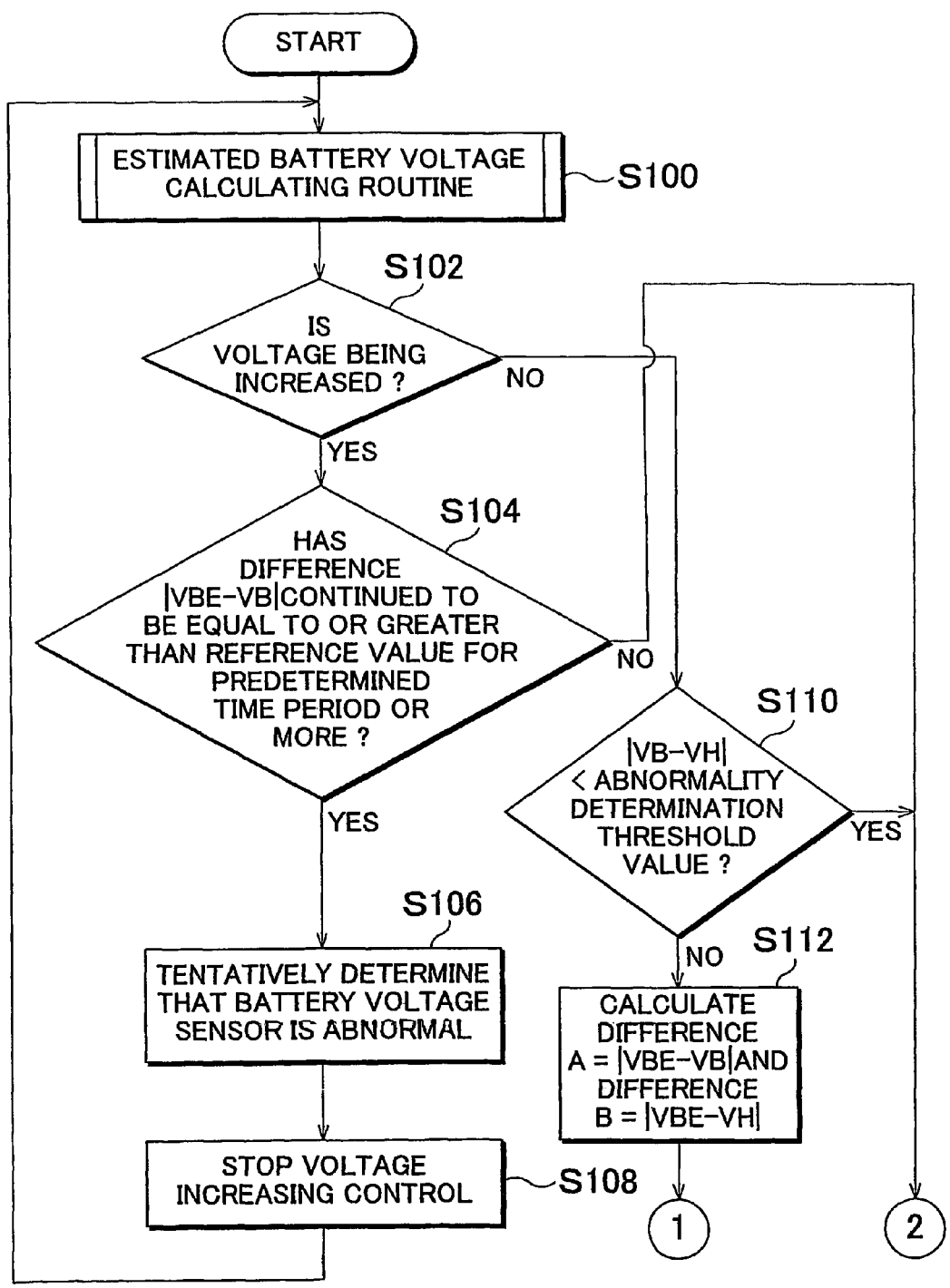
FIGS. 3A, 3B is a flowchart showing a control structure of a program (main routine) performed by an ECU in FIG. 1.
Figure 3B:
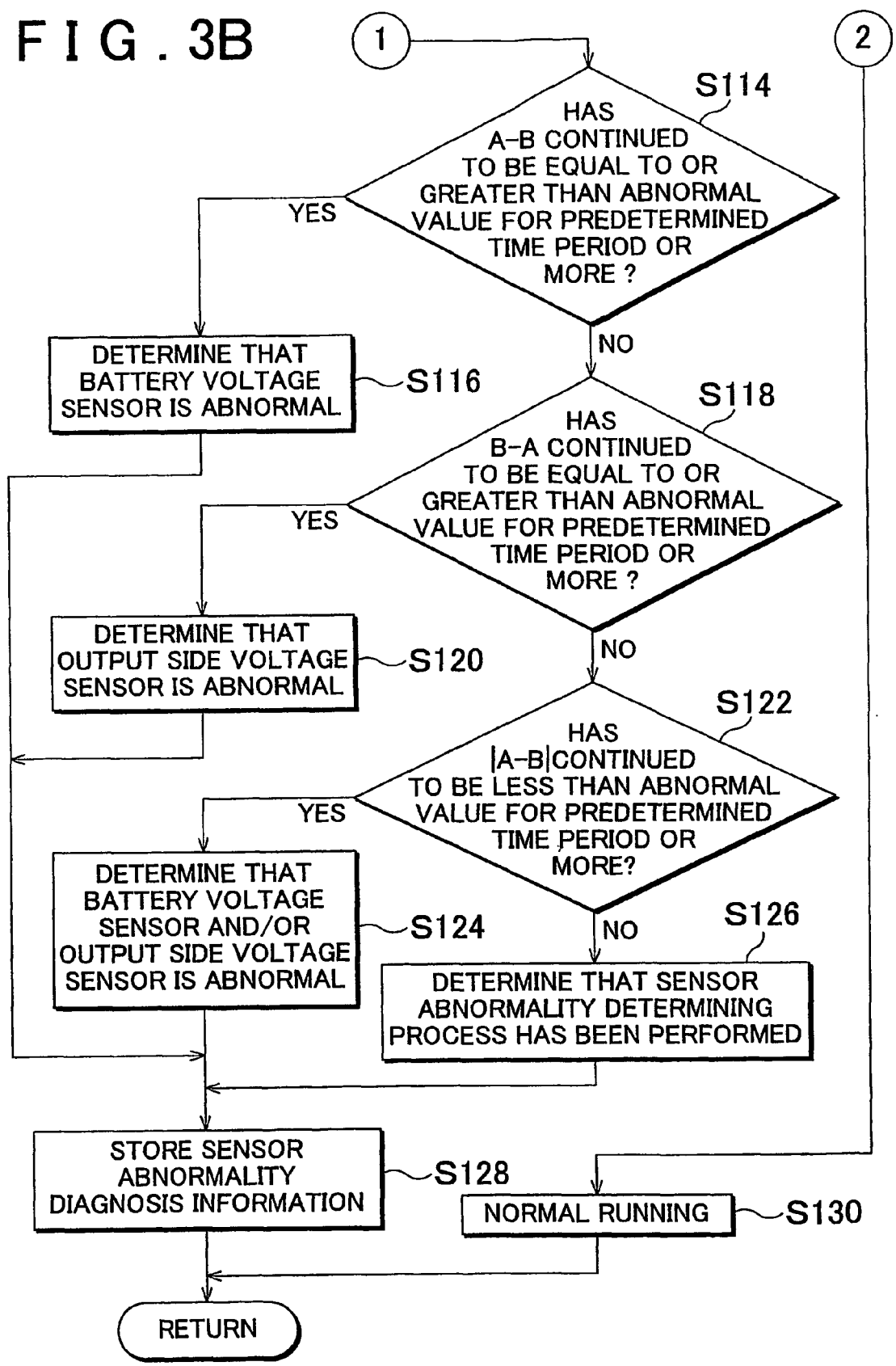

Referring to FIGS. 3A, 3B, description will be made on a control structure of a program performed by the ECU 1000, which is the abnormality monitoring apparatus according to the embodiment of the invention.

In step S100, the ECU 1000 performs an estimated battery voltage calculating routine (sub routine). The estimated battery voltage calculating routine will be described in detail later.

In step S102, the ECU 1000 determines whether the DC-DC converter 400 is performing the operation for increasing the voltage. If the DC-DC converter 400 is performing the operation for increasing the voltage (i.e., YES in step S102), the routine proceeds to step S104. If not (i.e., NO in step S102), the routine proceeds to step S110.

In step S104, the ECU 1000 determines whether a difference |VBE-VB| between the estimated battery voltage VBE calculated by the estimated battery voltage calculating routine and the battery voltage VB detected by the battery voltage sensor 610 has continued to be equal to or greater than a reference value for a predetermined time period or more. If the difference |VBE-VB| has continued to be equal to or greater than the reference value for the predetermined time period or more (YES in step S104), the routine proceeds to step S106. If not (i.e., NO in step S104), the routine proceeds to step S130.

In step S106, the ECU 1000 tentatively determines that the battery voltage sensor 610 is abnormal. In step S108, the ECU 1000 stops voltage increasing control for the DC-DC converter 400, which is control for operating the DC-DC converter 400 to increase the voltage. In step S110, the ECU 1000 determines whether an absolute value |VB-VH| of the difference between the battery voltage VB detected by the battery voltage sensor 610 and the increased voltage VH detected by the output side voltage sensor 420 is less than an abnormality determination threshold value. If the absolute value |VB-VH| of the difference between the battery voltage VB detected by the battery voltage sensor 610 and the increased voltage VH detected by the output side voltage sensor 420 is less than the abnormality determination threshold value (i.e., YES in step S110), the routine proceeds to step S130. If not (i.e., NO in step S110), the routine proceeds to step S112.

In step S112, the ECU 1000 calculates, as a difference A, the absolute value |VBE-VB| of the difference between the estimated battery voltage VBE calculated by the estimated battery voltage calculating routine and the battery voltage VB detected by the battery voltage sensor 610. In addition, the ECU 1000 calculates, as a difference B, the absolute value |VBE-VH| of the difference between the estimated battery voltage VBE calculated by the estimated battery voltage calculating routine and the increased voltage VH detected by the output side voltage sensor 420.

In step S114, the ECU 1000 determines whether a value (A-B) obtained by subtracting the calculated difference B from the calculated difference A has continued to be equal to or greater than an abnormal value for a predetermined time period or more. If the value (A-B) has continued to be equal to or greater than the abnormal value for the predetermined time period or more (i.e., YES in step S114), the routine proceeds to step S116. If not (i.e., NO in step S114), the routine proceeds to step S118.

In step S116, the ECU 1000 determines that the battery voltage sensor 610 is abnormal.

In step S118, the ECU 1000 determines whether a value (B-A) obtained by subtracting the calculated difference A from the calculated difference B has continued to be equal to or greater than the abnormal value for the predetermined time period or more. If the value (B-A) has continued to be equal to or greater than the abnormal value for the predetermined time period or more (i.e., YES in step S118), the routine proceeds to step S120. If not (i.e., NO in step S118), the routine proceeds to step S122.

In step S120, the ECU 1000 determines that the output side voltage sensor 420 is abnormal.

In step S122, the ECU 1000 determines whether an absolute value |A-B| of the value obtained by subtracting the calculated difference B from the calculated difference A has continued to be less than the abnormal value for the predetermined time period or more. If the absolute value |A-B| has continued to be less than the abnormal value for the predetermined time period or more (i.e., YES in step S122), the routine proceeds to step S124. If not (i.e., NO in step S122), the routine proceeds to step S126.

In step S124, the ECU 1000 determines that the battery voltage sensor 610 and/or the output side voltage sensor 420 is abnormal. That is, the ECU 1000 determines that one of the sensors is abnormal, or both of the sensors are abnormal.

In step S126, the ECU 1000 determines that the sensor abnormality determining process in the step S112 and subsequent steps has been performed. In the case where the DC-DC converter 400 is not performing the operation for increasing the voltage, basically the battery voltage VB detected by the battery voltage sensor 610 and the increased voltage VH detected by the output side voltage sensor 420 need to be the same. If the absolute value of the difference between the battery voltage VB and the increased voltage VH is equal to or greater than the abnormality determination threshold value, the sensor abnormality determining process in step S112 and subsequent steps is performed. There is a case where none of the following conditions is satisfied: 1) the condition that the battery voltage sensor 610 is abnormal, 2) the condition that the output side voltage sensor 420 is abnormal, and 3) the condition that both of the battery voltage sensor 610 and the output side voltage sensor 420 are abnormal. In this case, it is determined that the sensor abnormality determining process has been performed.

In this case, an abnormal sensor is not determined. However, in order to memorize that the sensor abnormality determining process has been performed, the ECU 1000 determines that the sensor abnormality determining process has been performed in step S126. This process in step S126 may be omitted if it is assumed that such a case does not occur, or if this process is not necessary though it is assumed that such a case may occur.

In step S128, the ECU 1000 stores sensor abnormality diagnosis information. The sensor abnormality diagnosis information contains information concerning the determined abnormal sensor (s) and the like. This information is stored in a memory incorporated in the ECU 1000, and is used for making a diagnosis.

In step S130, the ECU 1000 controls the vehicle such that the vehicle runs in a normal running state.

Figure 4A:
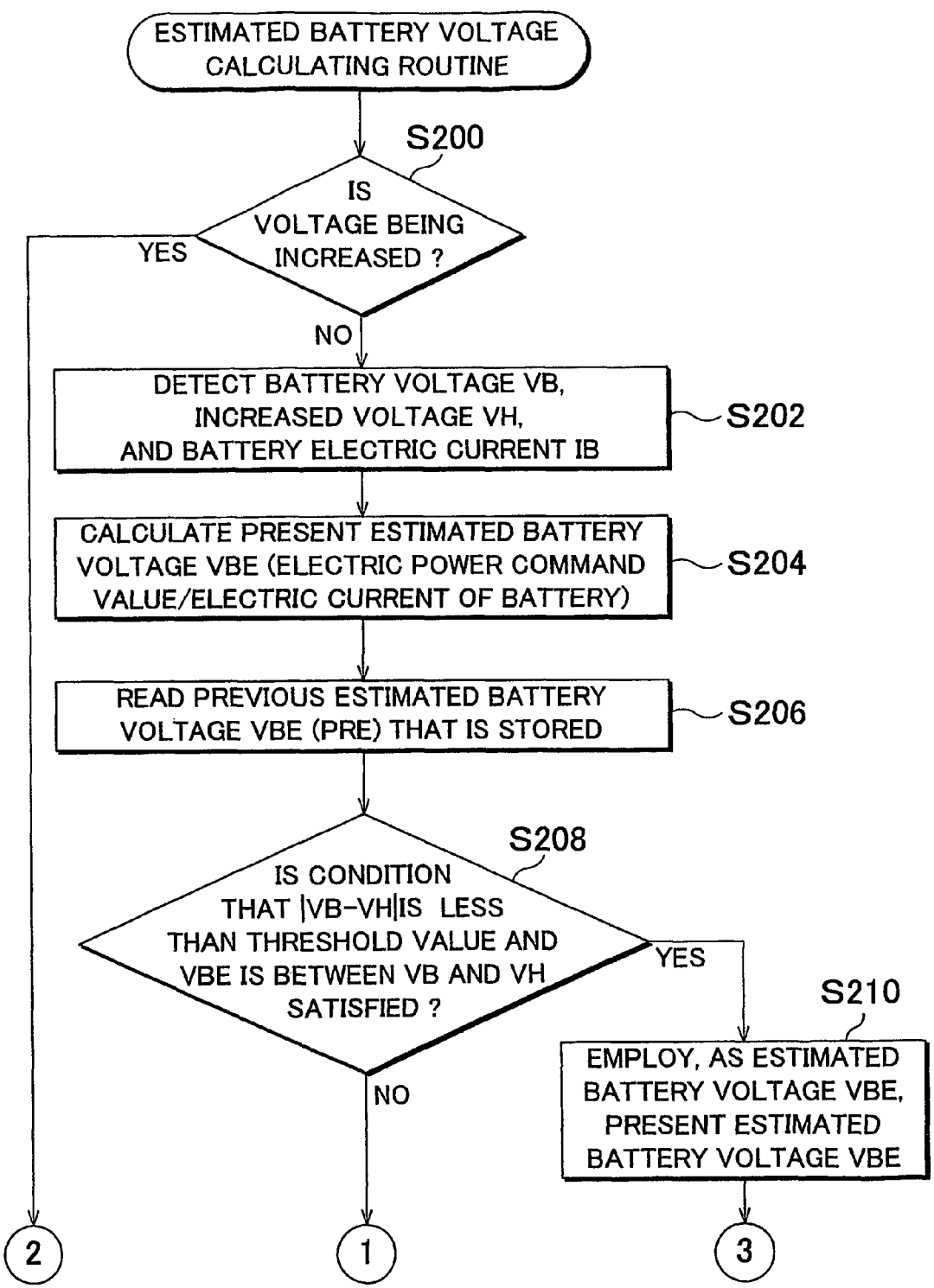

Referring to FIGS. 4A, 4B, the estimated battery voltage calculating routine in step S100 in FIG. 3 will be described in detail.

In step S200, the ECU 1000 determines whether the DC-DC converter 400 is performing the operation for increasing the voltage. If the DC-DC converter 400 is performing the operation for the increasing the voltage (i.e., YES in step S200), the routine proceeds to step S220. If not (i.e., NO in step S200), the routine proceeds to step S202.

In step S202, the ECU 1000 detects the battery voltage VB based on the signal sent from the battery voltage sensor 610, detects the increased voltage VH based on the signal sent from the output side voltage sensor 420, and detects the battery electric current IB based on the signal sent from the battery electric current sensor 620.

In step S204, the ECU 1000 calculates the present estimated battery voltage VBE by dividing an electric power command value by the battery electric current IB. The electric power command value is the command value indicating electric power required for generating driving torque necessary for driving the vehicle, and is calculated by the ECU 1000 based on the running state of the vehicle.

In step S206, the ECU 1000 reads a previous estimated battery voltage VBE (PRE) stored in the memory.

In step S208, the ECU 1000 determines whether the absolute value |VB-VH| of the difference between the battery voltage VB detected by the battery voltage sensor 610 and the increased voltage VH detected by the output side voltage sensor 420 is less than the threshold value, and the present estimated battery voltage value VBE that is calculated is between the battery voltage VB and the increased voltage VH. If the absolute value |VB-VH| of the difference between the battery voltage VB and the increased voltage VH is less than the threshold value, and the present estimated battery voltage value VBE is between the battery voltage VB and the increased voltage VH (i.e., YES in step S208), the routine proceeds to step S210. If not (i.e., NO in step S208), the routine proceeds to step S212.

In step S210, the ECU 1000 employs, as the estimated battery voltage VBE, the present estimated battery voltage VBE (i.e., the estimated battery voltage that is calculated in step S204).

In step S212, the ECU 1000 determines whether the absolute value |VB-VH| of the difference between the battery voltage VB detected by the battery voltage sensor 610 and the increased voltage VH detected by the output side voltage sensor 420 is less than the threshold value, and the present estimated battery voltage value VBE that is calculated is not between the battery voltage VB and the increased voltage VH. If the absolute value |VB-VH| of the difference between the battery voltage VB and the increased voltage VH is less than the threshold value, and the present estimated battery voltage value VBE is not between the battery voltage VB and the increased voltage VH (i.e., YES in step S212), the routine proceeds to step S214. If not (i.e., NO in step S212), the routine proceeds to step S216.

In step S214, the ECU 1000 employs, as the estimated battery voltage VBE, one of the detected battery voltage VB and the detected increased voltage VH which is nearer to the estimated battery voltage VBE (both of the battery voltage VB and the increased voltage VH are detected in step S202). In step S216, the ECU 1000 employs, as the estimated battery voltage VBE, the previous estimated battery voltage VBE (RE) that is stored in the memory.

In step S218, the ECU 1000 stores, as the latest corrected estimated battery voltage VBE (PRE), the estimated battery voltage VBE that is employed in step S216, in the memory. In step S220, the ECU 1000 employs, as the estimated battery voltage VBE, the previous estimated battery voltage VBE (PRE) that is stored in the memory immediately before the voltage starts to be increased.

Hereinafter, description will be made on an operation of the vehicle including the ECU 1000 which is the abnormality monitoring apparatus having the aforementioned structure and operating based on the aforementioned flowchart, according to the embodiment of the invention.

While the vehicle is running, an abnormality determining process is performed at a predetermined sampling time (for example, at a sampling time decided by clock frequency of a CPU (Central Processing Unit) included in the ECU 1000).

The estimated battery voltage estimating routine for calculating the estimated battery voltage VBE used for the abnormality determining process is performed (S100).

If the DC-DC converter 400 is not performing the operation for increasing the voltage (i.e., NO in step S200), the battery voltage VB is detected by the battery voltage sensor 610, the increased voltage VH is detected by the output side voltage sensor 420 provided on the output side of the DC-DC converter 400, and the battery electric current IB is detected by the battery electric current sensor 620 (S202). The present estimated battery voltage VBE is calculated by dividing the electric power command value by the battery electric current IB (S204). The previous estimated battery voltage VBE (PRE) that is stored in the memory one sampling step before is read (S206). The previous estimated battery voltage VBE (PRE) that is read in step S206 is the most accurate estimated voltage value at present.

The absolute value |VB-VH| of the difference between the battery voltage VB detected by the battery voltage sensor 610 and the increased voltage VH detected by the output side voltage sensor 420 is calculated. If the absolute value |VB-VH| of the difference between the battery voltage VB and the increased voltage VH is less than the threshold value, and the present estimated battery voltage value VBE is between the battery voltage VB and the increased voltage VH (i.e., YES in step S208), it is determined that the present estimate battery voltage value VBE that is calculated in step S204 is sufficiently accurate. Thus, the present estimated battery voltage VBE that is calculated in step S204 is employed as the estimated battery voltage VBE used for the-abnormality determining process that will be described later (S210).

If the absolute value |VB-VH| of the difference between the battery voltage VB and the increased voltage VR is less than the threshold value, and the present estimated battery voltage value VBE that is calculated is not between the battery voltage VB and the increased voltage VH (i.e., YES in step S212), one of the battery voltage VB detected in S202 and the increased voltage detected in step S202, whichever is nearer to the present estimated battery voltage VBE, is employed as the estimated battery voltage VBE used for the abnormality determining process that will be described later (S214).

If none of the aforementioned conditions (S208, S210) is satisfied, the previous estimated battery voltage VBE (PRE) that is previously stored in the memory is employed as the estimated battery voltage VBE used for the abnormality determining process that will be described later (S216).

A calculation is performed so as to obtain a more accurate estimated battery voltage VBE at each sampling time in this manner. Thus, learning is performed such that the estimated battery voltage becomes more accurate.

If the DC-DC converter 400 is performing the operation for increasing the voltage (i.e., YES in step S200), the previous estimated battery voltage VBE (PRE) that is previously stored in the memory is employed as the estimated battery voltage VBE used for the abnormality determining process that will be described later (S220).

After the estimated battery voltage calculating routine is finished, if the DC-DC converter 400 is performing the operation for increasing the voltage (i.e., YES in step S102), and if it is determined that a difference |VBE-VB| between the estimated battery voltage VBE calculated by the estimated battery voltage calculating routine and the battery voltage VB detected by the battery voltage sensor 610 has continued to be equal to or greater than a reference value for a predetermined time period or more (i.e., YES in step S104), it is tentatively determined that the battery voltage sensor 610 is abnormal (S106). In this case, voltage increasing control (including voltage decreasing control) for the DC-DC converter 400 is stopped (S108).

If the absolute value |VB-VH| of the difference between the battery voltage VB detected by the battery voltage sensor 610 and the increased voltage VH detected by the output side voltage sensor 420 is equal to or greater than the abnormality determination threshold value (i.e., NO in step S110), the absolute value |VBE-VB| of the difference between the estimated battery voltage VBE and the battery voltage VB is calculated as difference A. In addition, the absolute value |VBE-VH| of the difference between the estimated battery voltage VBE and the increased voltage VH is calculated as difference B (S112).

If the value (A-B) obtained by subtracting the difference B from the difference A has continued to be equal to or greater than the abnormal value for the predetermined time period or more (i.e., YES in step S114), it is determined that the battery voltage sensor 610 is abnormal (S116). This is because it is determined that the voltage value detected by the battery voltage sensor 610 has a larger error.

If the value (B-A) obtained by subtracting the difference A from the difference B has continued to be equal to or greater than the abnormal value for the predetermined time period or more (i.e., YES in step S118), it is determined that the output side voltage sensor 420 is abnormal (S120). This is because it is determined that the voltage value detected by the output side voltage sensor 420 has a larger error.

If the absolute value |A-B| of the value obtained by subtracting the difference B from the difference A has continued to be less than the abnormal value for the predetermined time period or more (i.e., YES in step S122), it is determined that the battery voltage sensor 610 and/or the output side voltage sensor 420 is abnormal (S124). This is because it cannot be determined which of the battery voltage sensor 610 and the output side voltage sensor 420 has a larger error.

Referring to FIG. 5, this determination will be described. The voltage values shown in FIG. 5 are exemplary, and the invention is not limited to the voltage values shown in FIG. 5.

In the case where the output side voltage sensor 420 is normal, since the DC-DC converter 400 is not performing the operation for increasing/decreasing the voltage, the difference B(=|VBE-VH|) becomes substantially 0. In this case, if the battery voltage sensor 610 is abnormal, the difference A(=|VBE-VB|) becomes large. As a result, the value (A-B) obtained by subtracting the difference B (approximately 0) from the difference A has continued to be equal to or greater than the abnormal value (for example 20 V) for the predetermined time period (for example 500 ms). The battery voltage sensor abnormal region in FIG. 5 shows this state. The upper limit of the difference based on which the battery voltage sensor 610 can be determined as abnormal is 25 V.

In the case where the battery voltage sensor 610 is normal, since the DC-DC converter 400 is not performing the operation for increasing the voltage or the operation for decreasing the voltage, the difference A(=|VBE-VB|) becomes substantially 0. In this case, if the output side voltage sensor 420 is abnormal, the difference B(=|VBE-VH|) becomes large. As a result, the value (B-A) obtained by subtracting the difference A (approximately 0) from the difference B has continued to be equal to or greater than the abnormal value (for example 20 V) for the predetermined time period (for example 500 ms). The output side voltage sensor abnormal region in FIG. 5 shows this state. The upper limit of the difference based on which the battery voltage sensor 420 can be determined as abnormal is 25 V.

Also, there is an undetectable region between the battery voltage sensor abnormal region and the output side voltage sensor abnormal region in FIG. 5. In the undetectable region, though the battery voltage sensor 610 and/or the output side voltage sensor 420 is abnormal, it is not possible to determine which of the sensors is abnormal. Even though the estimated battery voltage VBE is calculated more accurately by learning, the error of the estimated battery voltage cannot be completely eliminated. Therefore, the undetectable region where it is not possible to determine which of the sensors is abnormal exists.

Also, there are a region where an abnormality of the battery voltage sensor 610 cannot be detected, and a region where an abnormality of the output side voltage sensor 420 cannot be detected (i.e., regions at a distance of 25 V or more from the undetectable region). In these regions, it is determined that the sensor abnormality determining process has been performed (S126).

Thus, if an abnormality of the voltage sensor is detected, information for determining the abnormal voltage sensor, information indicating the sensor abnormality determining process has been performed, and the like are stored in the memory as the sensor abnormality diagnosis information. For example, a warning lamp provided in a dashboard is turned on and off based on the information contained in the sensor abnormality diagnosis information, whereby a driver of the vehicle is notified of the abnormality of the voltage sensor.

As described above, the ECU which is the abnormality monitoring apparatus according to the embodiment of the invention monitors the difference between the battery voltage VB detected by the battery voltage sensor and the estimated battery voltage VBE in the case where the DC-DC converter is performing the operation for increasing the voltage. If the difference has continued to be equal to or greater than the reference value for a long time period, it is tentatively determined that the battery voltage sensor is abnormal, and the DC-DC converter is caused to stop the operation for increasing the voltage.

In the case where the DC-DC converter is not performing the operation for increasing the voltage, if the battery voltage sensor and the output side voltage sensor provided on the output side of the DC-DC converter are normal, the absolute value of the difference between the voltage values detected by the voltage sensors is small. Thus, it can be determined that the voltage sensors are normal. If not, the absolute value (first absolute value) of the difference between the estimated battery voltage and the detected battery voltage and the absolute value (second absolute value) of the difference between the estimated battery voltage and the detected output side voltage are calculated. If the value obtained by subtracting the second absolute value from the first absolute value is large, it can be determined that the detected battery voltage has a large error. Accordingly, it can be determined that the battery voltage sensor is abnormal. If the value obtained by subtracting the first absolute value from the second absolute value is large, it can be determined that the detected output side voltage has a large error. Accordingly, it can be determined that the output side voltage sensor is abnormal.

In the aforementioned flowchart shown in FIG. 3, after the process in step S108 is performed, the routine returns to step S100. However, the routine may return to step S102 or step S110 after the process in step S108 is performed.

Hereinafter, description will be made on the vehicle including the ECU which is the abnormality monitoring apparatus according to a modified example of the embodiment of the invention.

FIRST MODIFIED EXAMPLE

In the modified example, the output side voltage sensor 420 in the aforementioned embodiment is provided in a duplex system. That is, two or more output side voltage sensors 420 that are independent of each other are provided in the duplex system, whereby the increased voltage VH can be detected.

Thus, at least the output side voltage sensor 420 on the output side of the DC-DC converter 400 is provided in the duplex system. Accordingly, even while the DC-DC converter 400 is performing the operation for increasing the voltage, the output side voltage sensors 420 indicate different increased voltages VH, whereby it is possible to determine which of the output side voltage sensors is abnormal.

SECOND MODIFIED EXAMPLE

In the modified example, in the case where the DC-DC converter 400 is not performing the operation for increasing the voltage, an abnormality of the battery voltage sensor 610 and an abnormality of the output side voltage sensor 420 are distinguished from each other based on electric power balance.

When the abnormality of the battery voltage sensor 610 and the abnormality of the output side voltage sensor 420 are distinguished from each other based on electric power balance, balance between electric power consumption on the battery side and electric power consumption on the load side (drive side) is calculated. If the electric power consumption on the battery side that is calculated based on the voltage value detected by the voltage sensor is not equal to the electric power consumption on the load side (drive side), the voltage sensor is determined as abnormal. More specifically, calculations are performed according to the following equations.

The electric power consumption on the battery side (1)=the battery voltage VB×the battery electric current IB The electric power consumption on the battery side (2)=the output side voltage VH×the battery electric current IB The electric power balance (1)=the electric power consumption on the battery side (1)−the electric power consumption on the drive side The electric power balance (2)=the electric power consumption on the battery side (2)−the electric power consumption on the drive side.

If the electric power balance (1) is larger than the electric power balance (2), the battery voltage sensor 610 is determined as abnormal. If the electric power balance (2) is larger than the electric power balance (1), the output side voltage sensor 420 is determined as abnormal. Thus, it is possible to distinguish an abnormality of the battery voltage sensor 610 from an abnormality of the output side voltage sensor 420.

THIRD MODIFIED EXAMPLE

In the modified example, an input side voltage sensor is provided on the input side of the DC-DC converter 400. The relation among a boost duty, the output side voltage VH and an input side voltage VL are represented by an equation, VH×the boost duty=VL. Therefore, it is possible to detect an abnormality of the input side voltage sensor and an abnormality of the output side voltage sensor based on a large difference between the voltage value detected by the input side sensor provided on the input side of the DC-DC converter 400 and the value obtained by VH×the boost duty.

Thus, the embodiment of the invention that has been disclosed in the specification is to be considered in all respects as illustrative and not restrictive. The technical scope of the invention is defined by claims, and all changes which come within the meaning and range of equivalency of the claims are therefore intended to be embraced therein.

The invention claimed is:

1. An abnormality monitoring apparatus in a load drive circuit which includes a converter for performing at least one of an operation for increasing a voltage and an operation for decreasing a voltage, and a battery connected to an input side of the converter, the converter supplying electric power to a load, the abnormality monitoring apparatus comprising:

first detecting means for detecting a voltage value of the battery;

second detecting means for detecting a voltage value on an output side of the converter;

battery voltage estimating means for calculating an estimated voltage value of the battery;

calculating means for calculating at least one of the difference value between the voltage value detected by the first detecting means and the estimated voltage value, and the difference value between the voltage value detected by the second detecting means and the estimated voltage value; and monitoring means for monitoring at least one of an abnormality of the first detecting means and an abnormality of the second detecting means based on each of the difference values and a predetermined threshold value.

2. The abnormality monitoring apparatus according to claim 1, wherein the monitoring means includes abnormality detecting means for detecting an abnormality of the first detecting means based on an absolute value of the difference between the voltage value of the battery detected by the first detecting means and the estimated voltage value in a case where the converter is performing the operation for increasing the voltage or the operation for decreasing the voltage.

3. The abnormality monitoring apparatus according to claim 1, further comprising control means for controlling the converter such that the converter stops the operation for increasing the voltage or the operation for decreasing the voltage when an abnormality of the first detecting means is tentatively detected in a case where the converter is performing the operation for increasing the voltage or the operation for decreasing the voltage, wherein the monitoring means includes determining means for determining which one of the first detecting means and the second detecting means is abnormal based on an absolute value of the difference between the voltage value of the battery detected by the first detecting means and the estimated voltage value, and an absolute value of the difference between the voltage value detected by the second detecting means and the estimated voltage value when the converter stops the operation for increasing the voltage or the operation for decreasing the voltage.

4. The abnormal monitoring apparatus according to claim 1, further comprising electric current value detecting means for detecting an electric current value of the battery, wherein the battery voltage estimating means includes estimated voltage value calculating means for calculating the estimated voltage value based on an electric power command value indicating a value of electric power supplied to the load and the electric current value of the battery.

5. The abnormal monitoring apparatus according to claim 4, wherein the battery voltage estimating means includes estimated voltage value learning calculating means for learning and calculating the estimated voltage value.

6. The abnormal monitoring apparatus according to claim 1, wherein the monitoring means includes abnormality monitoring means for monitoring an abnormality of at least one of the first detecting means and the second detecting means by continuing to monitor an abnormal state of at least one of the first detecting means and the second detecting means for a predetermined time or more.

7. An abnormality monitoring method in a load drive circuit which includes a converter for performing at least one of an operation for increasing a voltage and an operation for decreasing a voltage, and a battery connected to an input side of the converter, the converter supplying electric power to a load, the abnormality monitoring apparatus comprising the steps of:

detecting a voltage value of the battery;

detecting a voltage value on an output side of the converter;

calculating an estimated voltage value of the battery;

calculating at least one of the difference value between the detected voltage value of the battery and the estimated voltage value, and the difference value between the detected voltage value on the output side of the converter and the estimated voltage value; and monitoring at least one of an abnormality of detection of the voltage value of the battery and an abnormality of detection of the voltage value on the output side of the converter based on each of the difference values and a predetermined threshold value.

8. An abnormality monitoring apparatus in a load drive circuit which includes a converter for performing at least one of an operation for increasing a voltage and an operation for decreasing a voltage, and a battery connected to an input side of the converter, the converter supplying electric power to a load, the abnormality monitoring apparatus comprising:

a first detector that detects a voltage value of the battery;

a second detector that detects a voltage value on an output side of the converter;

a battery voltage estimating portion which calculates an estimated voltage value of the battery;

a calculating portion which calculates at least one of the difference value between the voltage value detected by the first detector and the estimated voltage value, and the difference value between the voltage value detected by the second detector and the estimated voltage value; and a monitoring portion which monitors at least one of an abnormality of the first detector and an abnormality of the second detector based on each of the difference values and a predetermined threshold value.

9. The abnormality monitoring apparatus according to claim 8, wherein the monitoring portion includes an abnormality detector that detects an abnormality of the first detector based on an absolute value of the difference between the voltage value of the battery detected by the first detector and the estimated voltage value in a case where the converter is performing the operation for increasing the voltage or the operation for decreasing the voltage.

10. The abnormality monitoring apparatus according to claim 8, further comprising a controller that controls the converter such that the converter stops the operation for increasing the voltage or the operation for decreasing the voltage when an abnormality of the first detector is tentatively detected in a case where the converter is performing the operation for increasing the voltage or the operation for decreasing the voltage, wherein the monitoring portion includes a determining portion that determines which one of the first detector or the second detector is abnormal based on an absolute value of the difference between the voltage value of the battery detected by the first detector and the estimated voltage value, and an absolute value of the difference between the voltage value detected by the second detector and the estimated voltage value when the converter stops the operation for increasing the voltage or the operation for decreasing the voltage.

11. The abnormal monitoring apparatus according to claim 8, further comprising an electric current value detector that detects an electric current value of the battery, wherein the battery voltage estimating portion includes an estimated voltage value calculating portion that calculates the estimated voltage value based on an electric power command value indicating a value of electric power supplied to the load and the electric current value of the battery.

12. The abnormal monitoring apparatus according to claim 11, wherein the battery voltage estimating portion includes an estimated voltage value learning calculating portion that learns and calculates the estimated voltage value.

13. The abnormal monitoring apparatus according to claim 8, wherein the monitoring portion includes an abnormality monitoring portion that monitors an abnormality of at least one of the first detector and the second detector by continuing to monitor an abnormal state of at least one of the first detector and the second detector for a predetermined time or more.

* * * * *